United States Patent [19]

Cooper et al.

[11] 4,047,951
[45] Sept. 13, 1977

[54] MARKER MAKING METHODS FOR CUTTING FABRIC PATTERNS

[75] Inventors: Shannon L. Cooper, Chicago, Ill.; Frank C. Adams, Cape Girardeau, Mo.

[73] Assignee: Hart Schaffner & Marx, Chicago, Ill.

[21] Appl. No.: 636,711

[22] Filed: Dec. 1, 1975

Related U.S. Application Data

[63] Continuation-in-part of Ser. No. 488,475, July 15, 1974, abandoned.

[51] Int. Cl.² .................................................. G03C 5/04
[52] U.S. Cl. ......................................... 96/27 R; 96/41; 96/44; 33/17 R
[58] Field of Search ................... 96/27 R, 41, 42, 43, 96/44; 8/2, 2.5; 33/11, 17 R, 17 A, 12

[56] References Cited

U.S. PATENT DOCUMENTS

| | | | |
|---|---|---|---|
| 1,136,170 | 4/1915 | Rubin | 96/41 |
| 1,866,866 | 7/1932 | Sutcliffe | 96/41 |
| 2,369,031 | 2/1945 | Engle | 96/41 |
| 2,589,105 | 3/1952 | Maiocchi | 33/17 A |
| 2,610,413 | 9/1952 | Dasey | 96/41 |
| 3,134,173 | 5/1964 | Williams | 33/17 |
| 3,615,474 | 10/1971 | Rosenberger | 96/41 |
| 3,784,380 | 1/1974 | Compare | 96/44 |
| 3,816,924 | 6/1974 | Cutri | 33/17 |

*Primary Examiner*—Edward C. Kimlin
*Attorney, Agent, or Firm*—Kinzer, Plyer, Dorn & McEachran

[57] ABSTRACT

A method of making both full size and miniature replicas of patterns on photographic film from conventional paperboard clothing patterns. The full size clothing pattern replicas on film may be arranged directly on a conventional marker sheet in place of the paperboard clothing patterns. The miniature pattern replicas may be arranged on miniature marker sheet replicas constructed to the same scale as the miniature pattern replicas. The layout may be copied and the copy of the miniature pattern layout may be used as a guide in laying out full size patterns or pattern replicas on a marker sheet or the copy may be enlarged and reproduced to its original scale on a light sensitive marker sheet. The clothing pattern replicas may be formed with integral blocking borders or blocking lines.

15 Claims, 30 Drawing Figures

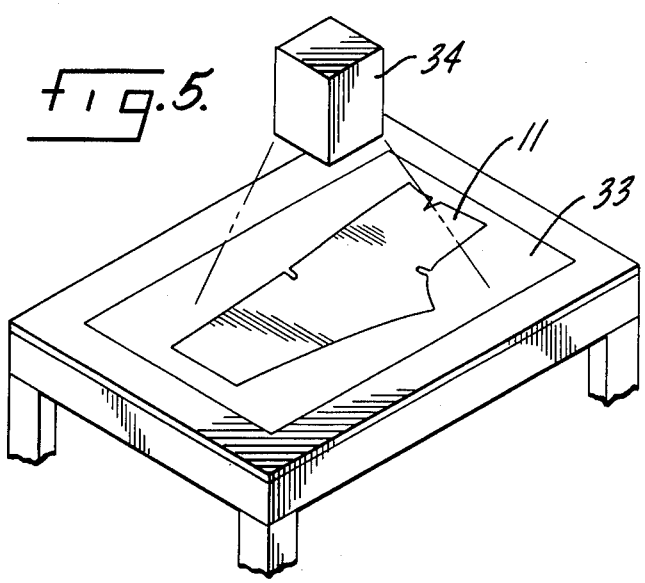
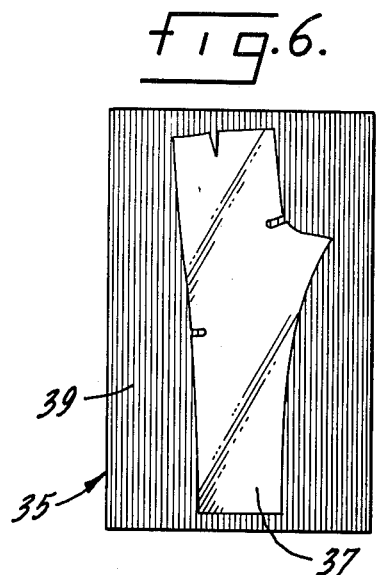
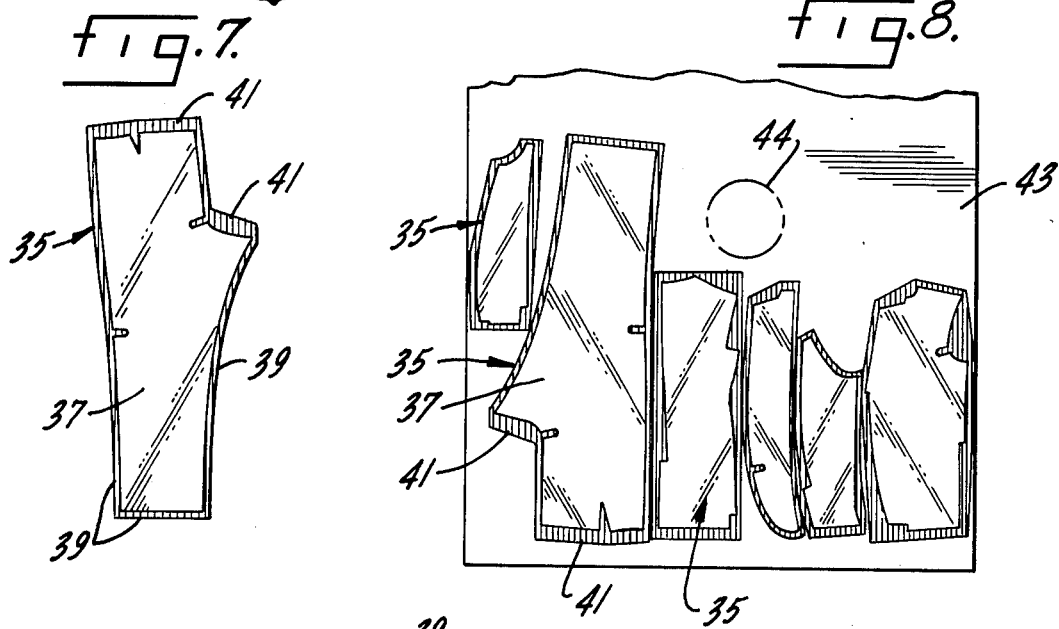
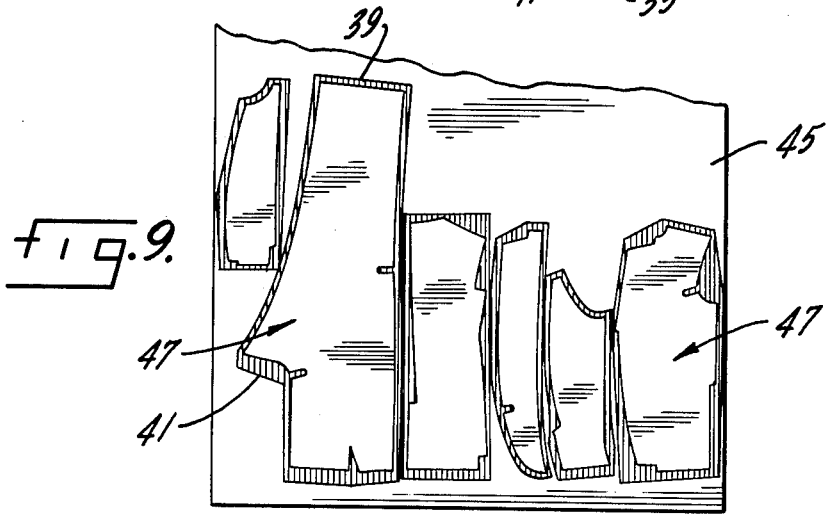

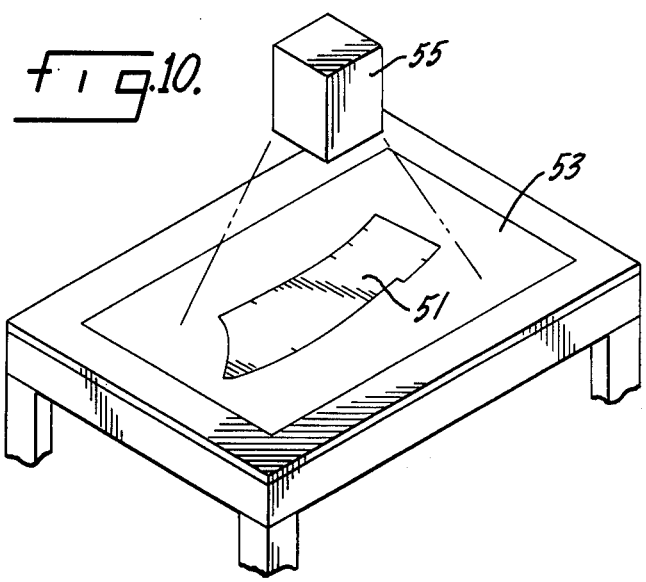
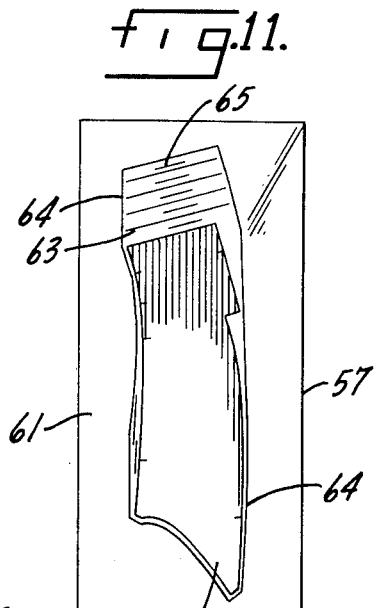
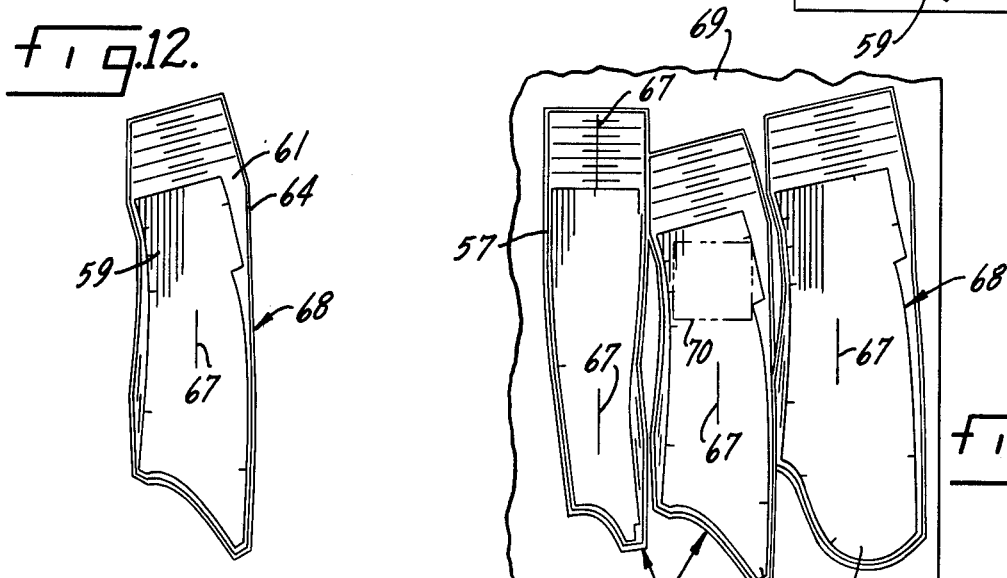
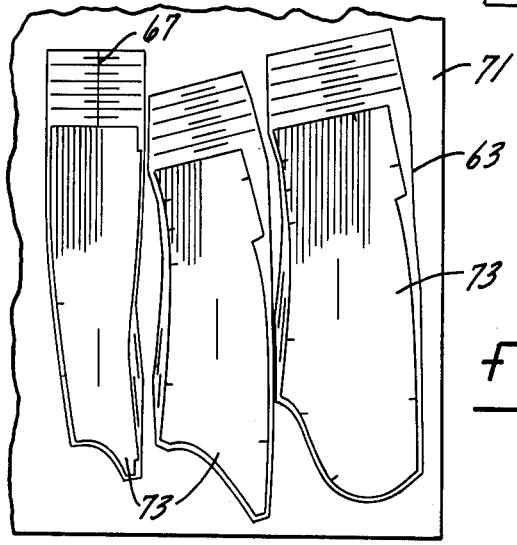

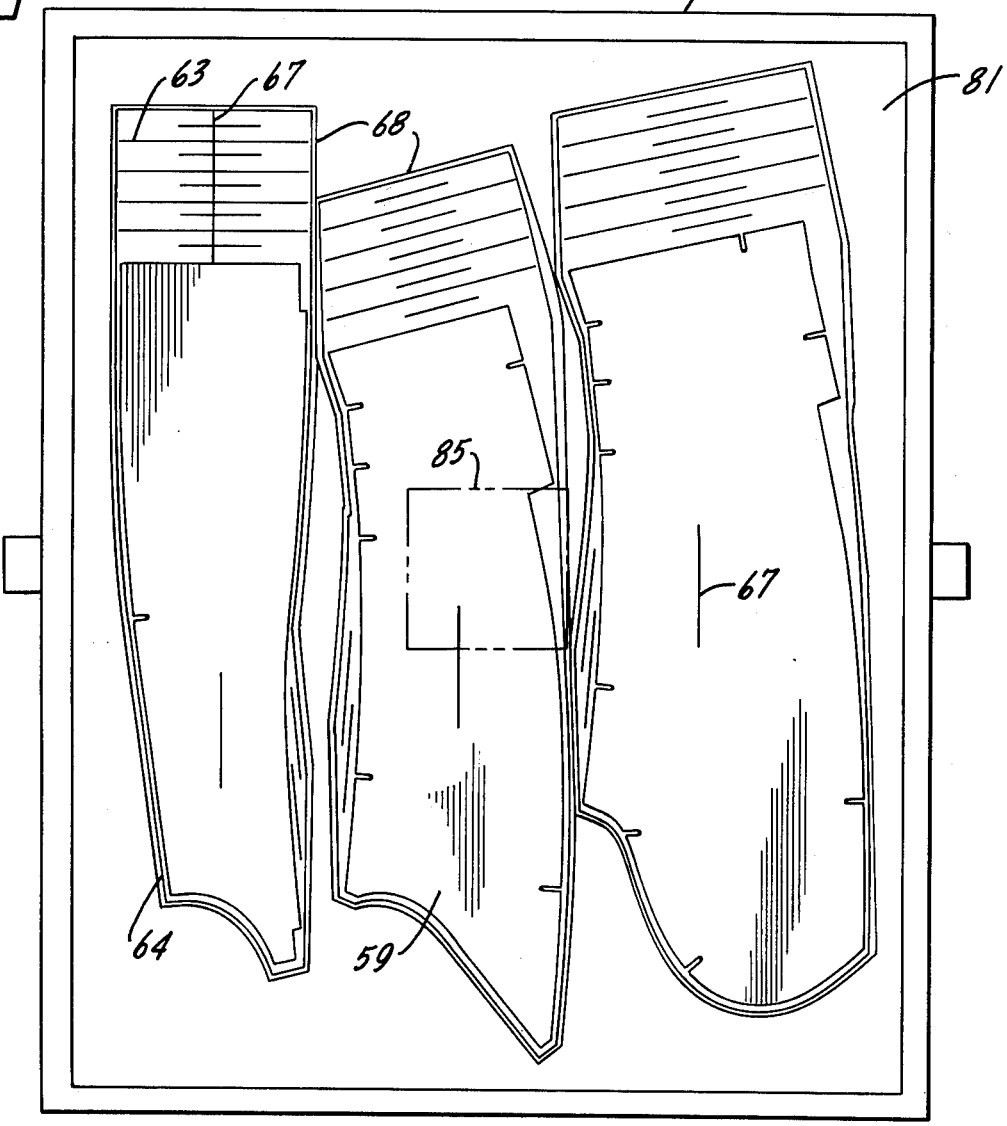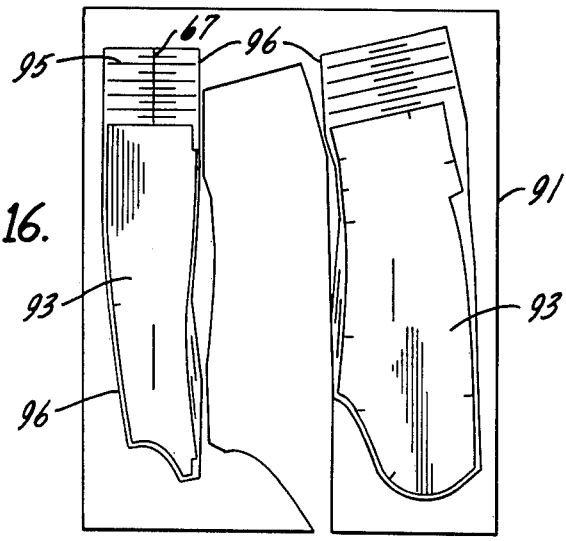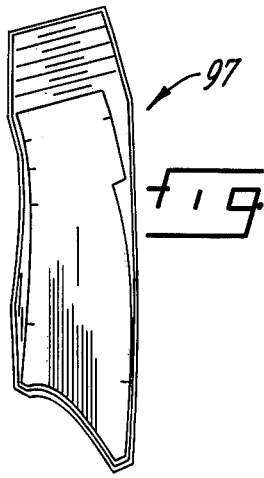

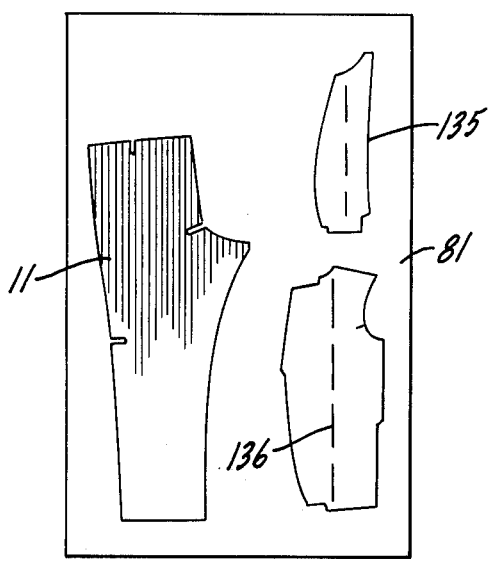
fig.24.
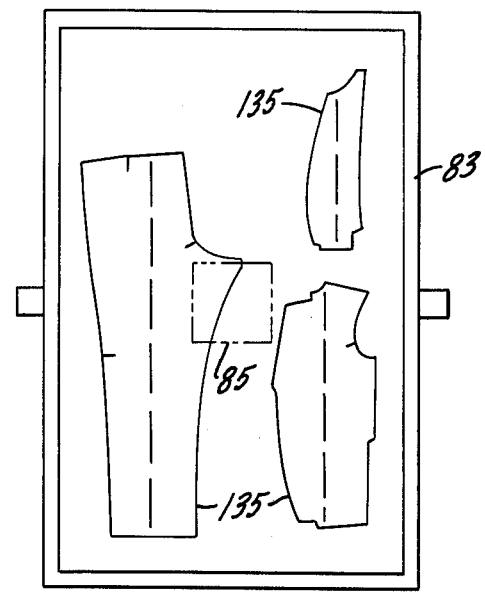
fig.25.
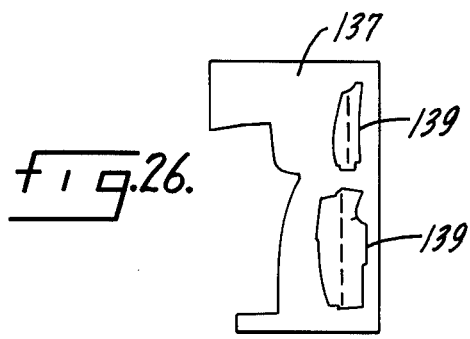
fig.26.
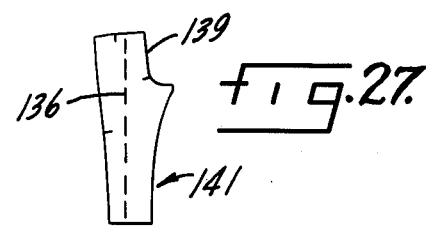
fig.27.
fig.28.
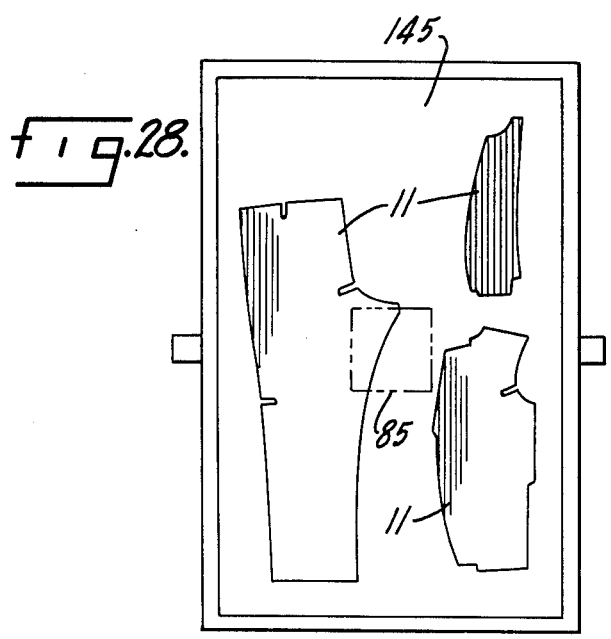
fig.29.
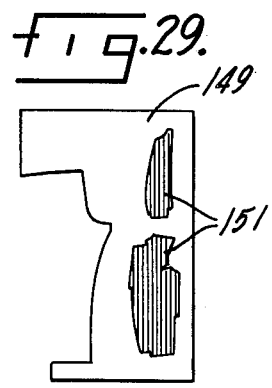
fig.30.
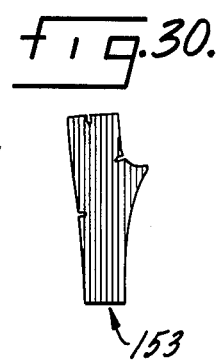

MARKER MAKING METHODS FOR CUTTING FABRIC PATTERNS

This application is a continuation-in-part of application Ser. No. 488,475, filed July 15, 1974 now abandoned.

BACKGROUND OF THE INVENTION

It has been conventional in the clothing industry to cut clothing pieces from layers of fabric called lays. These lays of material can be as much as 4 to 6 inches thick, 5 feet wide and 10 to 15 yards long. The individual fabric pieces are cut using a paper marker sheet which is placed on the lay of material as a guide. The marker sheet contains replicas of the clothing patterns arranged in closely spaced relation to one another to provide the maximum utilization of the cloth to be cut.

Marker sheets have conventionally been made by positioning paperboard patterns on a light table within markings on the table showing the dimensions of the lay of fabric. The paperboard pattern pieces were arranged in closely spaced relation to each other to minimize waste in the fabric to be cut. After the paperboard patterns were arranged in the desired layout, they were covered with a sheet of clear heavy plastic to hold them in place. A sheet of light sensitive paper of the diazotype has then spread over the plastic sheet. The patterns and diazopaper were exposed to light. The diazopaper was then developed by an ammonia process to make a permanent master copy from which duplicate marker sheets were made.

In cutting plaid fabrics or fabrics having repeating designs, it is necessary to cut the fabric larger than the pattern to allow for alignment of the plaid or design before a final cut of the fabric is made. The fabric is cut oversize on one or more sides of the pattern depending on whether or not the plaid or design repeats in one or both directions. Thus, when making marker sheets for fabrics of this type, it is necessary to make the markers oversize. This is presently accomplished by positioning the paperboard patterns on the light table so that there is sufficient spacing between the patterns to provide the extra material. This additional space is called "blocking". When the patterns are properly laid out on the light table, a diazopaper master copy is made of the pattern layout in the manner previously described. Copies are then made from the master. The blocking distances around the pattern marker must be drawn in on the marker sheet copy. This manual marking of blocking distances must be done on each copy since each copy is destroyed when it is used.

The foregoing processes are time consuming and, since marker makers are among the most highly paid workers in the clothing industry, this process is extremely expensive. Additionally, the clothing manufacturers must purchase and store large numbers of paperboard patterns. These patterns are not only expensive but also require large amount of storage space. For these reasons, many attempts have been made to eliminate or modify the conventional methods of making marker sheets for cutting both ordinary and plaid fabrics. For example, U.S. Pat. No. 3,816,924 to Frank J. Cutri teaches the use of thin flexible self-supporting plastic sheets having opaque markings thereon which are tracings of the pattern to be cut. Markings also record other information such as notch markings, drill holes, sizes and other cutting instructions. This patent calls for the cutting of the thin sheet of plastic to a configuration slightly larger than and approximately conforming to the configuration of the pattern. The pattern is then traced onto the transparent plastic sheet using the opaque material. In another aspect, the Cutri patent teaches the cutting of a plastic pattern having the same outline as a paperboard pattern piece and the use of the plastic pattern to trace the outline of the pattern.

The clothing industry has also attempted to overcome the difficulties and to reduce the expense of the conventional marker making processes in other ways. One method has been through the use of miniature patterns. Miniature patterns are laid out on a replica of a marker sheet constructed to the same scale. The miniature patterns are arranged on the miniature marker sheet to minimize waste of the cloth to be cut. It has been found to be more efficient to make a layout using miniature patterns since the person arranging the miniature patterns has a better overall view of the marker sheet and the relationship between the various patterns then he would have using full size patterns and a full size marker sheet. The advantages of working with miniatures can be better appreciated when it is realized that a full size layout of patterns can cover an area as large as 5 feet by 50 to 75 feet. When the miniature patterns are laid out in the desired manner on the miniature replica of the marker sheet, a photograph can be made of the layout. This photograph can be used by a marker maker as a guide to lay out the full size patterns on a full size marker sheet.

Miniature pattern layouts on miniature replicas of marker sheets have also been used to make full size marker sheets. This has been accomplished by making a contact print of the miniature marker layout on a negative film. The negative film is enlarged in a continuous enlarger which projects and prints the pattern layout on a full size light sensitive marker paper. However, the manufacture of full size marker sheets from miniature patterns in this continous enlargement process has not been entirely satisfactory. It is believed that the problem resides in the miniature patterns. Conventionally, the miniature patterns have been cut from a thin sheet of plastic using a pantograph device which follows the outline of a full size paperboard pattern. The miniature plastic pattern is cut by a heated stylus carried by the pantograph. The quality of the edges of the miniature pattern depends on the skill of the pantograph operator. If the movement of the stylus is not consistently uniform, the miniature pattern will not be an exact reduced scale replica of the full size pattern. Also, the use of a heated stylus can form ragged edges on the miniature pattern as well as burn and melt spots when the stylus is moved at an irregular or too slow a rate. Imperfections in the edges of the miniature patterns are magnified when the patterns are enlarged and printed on the full size marker sheet.

SUMMARY OF THE INVENTION

This invention is concerned with methods of photographically reproducing both full size and miniature pattern replicas on film for use in forming markers for cutting fabric to be used in the manufacture of clothing.

An object of this invention is a method for utilizing full size photographic replicas of conventional clothing patterns to make marker sheets.

Another object is a method of utilizing full size photographic replicas of conventional clothing patterns which replicas carry their own blocking borders for use in cutting plaid and repeating design fabrics.

Another object is a method of utilizing full size photographic replicas of conventional clothing patterns to make miniature patterns.

Another object is a method of making miniature patterns having integral blocking borders or blocking distance lines formed thereon.

Another object is a method of making miniature patterns which can be reproduced into full size markers with minimum distortion.

Other objects may be found in the following specification, claims and drawings.

BRIEF DESCRIPTION OF THE DRAWINGS

The invention is illustrated more or less diagrammatically in the following drawings wherein:

FIG. 5 is a perspectifve view showing the use of a clothing pattern to create a negative film replica in an alternative method of this invention;

FIG. 6 is a negative film replica created from the pattern of FIG. 5;

FIG. 7 shows the negative film replica of FIG. 6 after trimming of the excess film around the image;

FIG. 8 shows a number of trimmed negative film replicas positioned on a sheet of light sensitive marker paper;

FIG. 9 shows a marker sheet having a plurality of marker images corresponding to those of the clothing patterns, each with integral blocking borders;

FIG. 10 is a perspective view of another alternate method of this invention;

FIG. 11 is a positive film replica created from the pattern shown in FIG. 10 with blocking distance lines and borders added;

FIG. 12 shows the positive film replica after trimming of excess film;

FIG. 13 shows a number of trimmed positive film replicas positioned on a sheet of light sensitive marker paper;

FIG. 14 shows a marker sheet having a plurality of marker images corresponding to those of the clothing patterns, each having various integral blocking distance lines;

FIG. 15 shows a number of full size pattern film replicas positioned for photographing;

FIG. 16 shows a positive film of the pattern film replicas of FIG. 15 in which the film images of the pattern replicas have been reduced in size and with one of the film images cut from the film;

FIG. 17 shows a reduced film image of a pattern replica after removal from the film;

FIG. 24 shows a full size clothing pattern positioned against a suitable background for tracing and tracings of other clothing patterns on said background;

FIG. 25 shows a number of tracings of full size clothing patterns arranged to be photographed;

FIG. 26 shows a positive film of the pattern tracings of FIG. 25 in which the tracings of the patterns have been reduced in size and with one of the film images cut from the film;

FIG. 27 shows a reduced film image of a pattern tracing after removal from the film;

FIG. 28 shows a number of full size clothing patterns positioned against a contrasting background and arranged to be photographed;

FIG. 29 shows a positive film of the pattern arrangement of FIG. 28 in which the images of the patterns have been reduced in size and with one of the film images cut from the film; and FIG. 30 shows a reduced film image of a pattern after removal from the film.

DESCRIPTION OF THE PREFERRED EMBODIMENTS

One method of this invention which may be used to make markers for use in cutting fabrics which subsequently will be manufactured into clothing, is shown in FIGS. 1 through 4 of the drawings. For clarity of illustration, the method will be shown and described using only a few of the many patterns used to make articles of men's clothing such as the coat and trousers of a suit.

Figure 1:
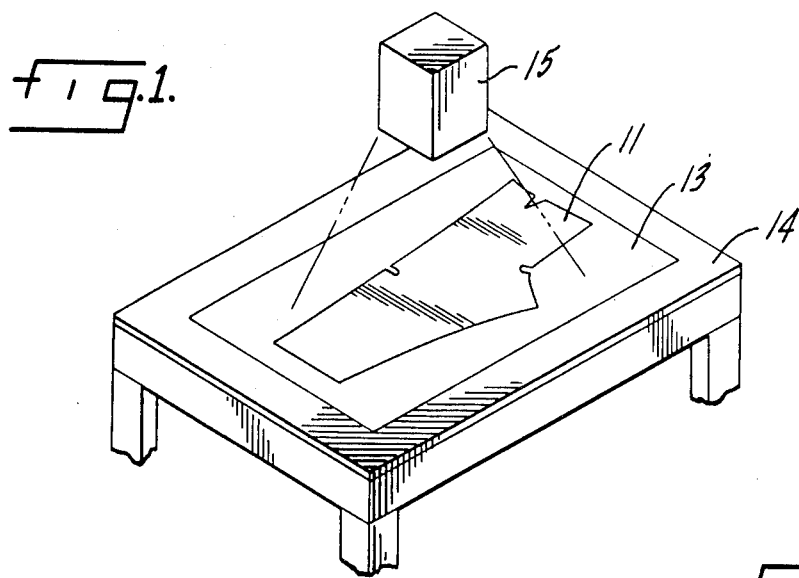
FIG. 1 is a perspective view showing the use of a full size clothing pattern to create a positive film replica.
Figures 2, 3:
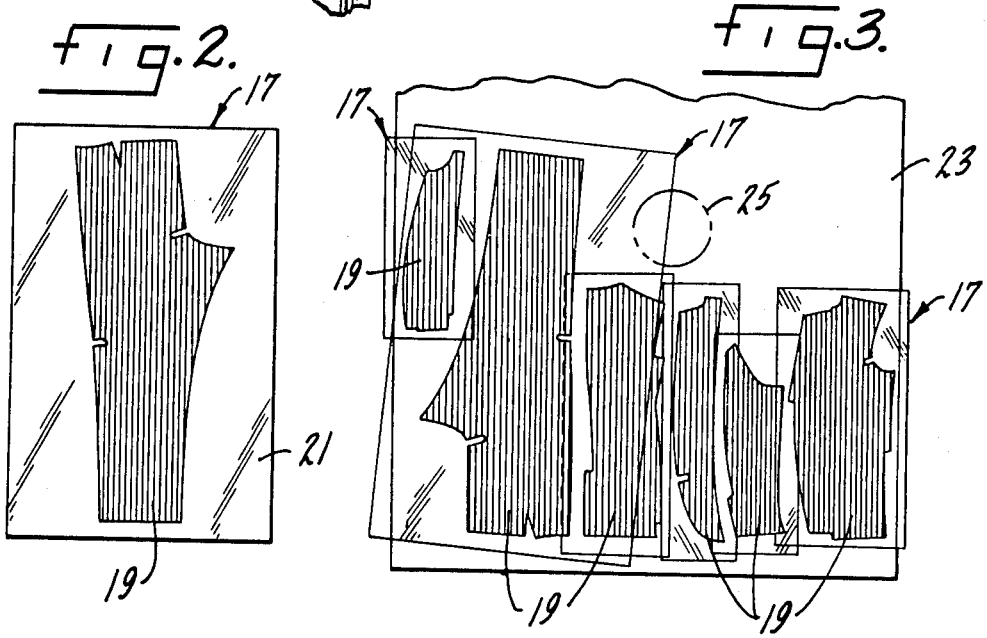
FIG. 2 is a positive film replica created from the pattern of FIG. 1.
FIG. 3 shows a number of pattern replicas positioned on a sheet of light sensitive marker paper.
Figure 4:
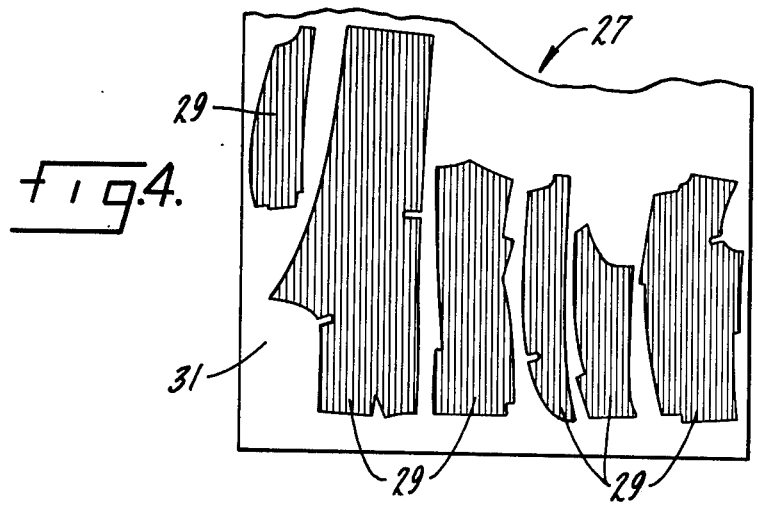
FIG. 4 shows a marker sheet having a plurality of marker images corresponding to those of the clothing patterns.

In FIG. 1, a pattern 11, which is a conventional cardboard pattern used for one portion of a pair of men's trousers is positioned against a sheet 13 of light sensitive reversal type photographic film. A film found suitable for this purpose is Kodak Super Speed Duplicating Film sold by the Eastman Kodak Company. Conveniently, the film may be placed on top of a vacuum table 14 and the pattern may be positioned on the film. A source of light 15 is located above the table. While the foregoing is the preferred arrangement, it should be understood that this method may be practiced with the order reversed. That is, the pattern could be positioned beneath the film with the light source positioned below the pattern. In either arrangement, the pattern and photographic film are exposed to a source of light 15. The exposed film 13 is then developed thereby providing, as shown in FIG. 2, a positive film 17 having an image 19 which is dark, which image corresponds in size and shape to the pattern 11. Surrounding this dark image is a clear border 21 of the positive film.

In the manner shown in FIG. 3 of the drawings, a number of positive films or pattern replicas 17, each having an image 19 of a different pattern needed to make up an article of clothing, are positioned on a positive light sensitive marker paper 23 which may be a diazotype paper. The positive films or pattern replicas 17 are positioned on the marker paper with the images 19 in close proximity to one another so as to reduce the amount of wasted fabric during cutting operations while allowing sufficient space for a cutting knife to pass between the markers. Because the positive films 17 of this invention have dark images corresponding in size and shape to the patterns and light or clear borders, it is not necessary to trim the borders of the films in order to position the images 19 in close proximity to one another. Because of the light borders surrounding the images, the borders of adjacent positive films may overlap when the positive films are positioned on the marker paper.

In the next step of this method of the invention, the overlapping pattern replicas 17 positioned on the light sensitive marker paper 23 are exposed to a source of light 25. The exposed light sensitive marker paper is then developed to provide a marker sheet 27 (FIG. 4) which has a plurality of closely spaced images 29. Each image 29 corresponds in size and shape to an original pattern 11 from which it was made. On the developed marker sheet 27, the images 29 are dark and are surrounded by light background 31. The marker sheet 27 may then be placed on a lay of fabric for cutting in the normal manner.

An alternate method of this invention is shown in FIGS. 5 through 9 of the drawings. This alternate method is especially adapted to making markers for use in cutting plaid fabrics and other fabrics having designs that repeat at regular intervals. Plaid fabrics, especially those which are used in men's clothing, are often cut so that the designs of the plaids match where the various parts of a garment are sewed together. To accomplish this, the parts are cut oversize so that there is sufficient material to accomodate a marker when the designs of abutting parts are finally aligned. In the case of plaids and other fabrics having repeating designs, the aligning of the designs is not done until after the over-size fabric parts have been cut from a lay of cloth.

In one conventional process for making markers for cutting plaid fabrics and fabrics with repeating designs, a cardboard pattern 11 for each part of a garment is positioned on an elongated piece of marker paper. This paper is conventionally covered with either dots or small numerals arranged in rectilinear patterns which permit proper alignment of the reference edges of each pattern. The outline of a pattern is traced onto the marker paper manually. When a marker is to be used with a plaid or other material having a repeating design (the design of a plaid or other fabric can repeat longitudinally and transversely with the same or different intervals in each direction), it is necessary for the worker tracing the pattern to indicate on the marker paper a border on one or more sides of the pattern. This is presently done manually by measuring from one or more edges of the pattern a prescribed distance which is equal to either one-half or a full interval of the design repeat distance of the plaid or other fabric to be cut. Lines at this distance from the edges of the pattern are then inscribed on the marker paper.

Another conventional method of making markers for plaid and repeating design fabrics involves positioning the paperboard patterns on a light table while leaving sufficient space between the patterns for the insertion of blocking borders. A diazotype print of the pattern arrangement is made in the conventional manner. Blocking border lines are drawn manually around the appropriate sides of the patterns on this print thus creating a marker sheet. This marker sheet is then placed on a lay of fabric to cut the oversize patterns. Since such a marker sheet can only be used once, it has been expensive and time consuming to make marker sheets for plaid and similar fabrics.

In this alternate embodiment of the invention, a conventional pattern 11 is positioned against a sheet of light sensitive photographic film 33 in the manner shown in FIG. 5. A film found suitable for this purpose is Kodagraph Super Negative Film sold by the Eastman Kodak Company. The film and pattern are exposed to a source of light for a selected period of time. The film 33 is then developed to provide a negative 35 (FIG. 6) having a clear image 37 which is identical in size and shape to the pattern 11. A dark border 39 of the negative surrounds the image 37.

The negative 35 is then cut around the perimeter of the image 37 leaving a blocking 41 of the dark border 39 around the image in the manner shown in FIG. 7. The blocking 41 is formed with a width equal to either a one-half or a full interval of the repeat of the plaid design on selected edges of the image. At least a quarter of an inch of the dark border 39 is left around all edges of the clear image 37 to indicate the proper spacing of the pattern negatives from one another when they are laid on a marker sheet. This spacing between the images allows room for a cutting knife to pass between markers.

The negatives 35 with their images 37 which have integral blockings 41 and dark borders 39 are then placed on a light sensitive diazotype paper 43 in the manner shown in FIG. 8. The positive light sensitive marker sheet 43 and the negatives 37 positioned thereon are exposed to a source of light 44. The exposed light sensitive marker sheet is then developed to provide a marker sheet 45 having a number of images 47 formed thereon as shown in FIG. 9. Each image is identical in size and shape to its pattern 11 and is surrounded by dark borders 39. The dark borders include blocking portions 41 necessary to cut the plaid fabrics over-size. When the marker sheet 45 is placed on a lay of fabric to be cut, the worker cuts around the periphery of the dark borders 39 of the image 47 thereby creating a marker. Each pile of cut fabric with its marker is then ready for processing.

In the next conventional processing step, which is not shown in the drawings, the designs of the individual pieces of plaid fabric are aligned in a conventional manner. A marker is then placed on top of the aligned pieces of fabric. The cutter then follows the outline of the image 47 of the marker to cut the pieces of plaid fabric.

Another alternate method of this invention is shown in FIGS. 10 through 14 of the drawings. This alternate method is especially adapted to making markers for use in cutting plaid fabrics and other fabrics having designs that repeat at regular intervals. In this alternate method of the invention, a conventional paperboard pattern 51 is positioned against a sheet 53 of light sensitive positive type photographic film in the manner shown in FIG. 10. The film and pattern are exposed to a source of light 55 for a selected period of time. The exposed film 53 is then developed, thereby providing, as shown in FIG. 11, a positive film 57 having an image 59 which is dark or opaque. This image is identical in size and shape to the pattern 51. Surrounding this dark or opaque image is a clear border 61 of the positive film. Because the positive film is contact printed from the paperboard pattern 51, the outer edges of the image 59 of the pattern are extremely sharp and accurate.

Lines 63 indicating blocking distances for various intervals of pattern or design repeat and lines 64 indicating borders are added to the positive film 57 using an opaque permanent type marking pen. By way of example, the line 63 closest to the pattern image 59 is spaced one-half inch from the outer edge of the image 59 and indicates a one-half interval of a plaid or design fabric having a one inch design repeat. The numeral 1 is positioned adjacent this line, but has been omitted from this drawing for clarity. Likewise, the second line 63 outwardly of the image 59 is located one inch from the edge of the image. It is identified by the numeral 2. Shorter lines 65 may be located between the lines 63 to designate one-half inch design repeat intervals. If desirable, additional indicia succh as notch lines, fabric alignment lines 67 and pattern identification numbers (not shown) which do not clearly show from the print of the pattern can be added. Of course, any other necessary information can also be added.

The marked positive film 57 may then be trimmed using a scissors or other cutting means outwardly of the outermost blocking lines 63 and border lines 64 to produce a pattern replica 68 carrying its own blocking lines which is shown in FIG. 12. A number of the pattern replicas 68 are positioned on a light sensitive diazotype sheet 69 in the manner shown in FIG. 13. The positive light sensitive marking sheet 69 and the pattern replicas 68 are exposed to a source of light 70. The exposed light sensitive marker sheet is then developed to provide a marker sheet 71 having a number of images 73 formed thereon as shown in FIG. 14. Each image 73 is opaque and is identical in size and shape to its pattern 51. Each image is surrounded by its designated blocking border lines 63 which indicate the blocking distances necessary to cut plaid and other repeating design fabrics oversize in accordance with the design repeat interval of the particular fabric. The pattern replicas 68 provide the additional advantage that a single pattern replica can be used to make markers for fabrics having different intervals of design repeat. Because the blocking and border lines are indicated by opaque lines marked on a clear border of the pattern image, adjacent pattern replicas can be overlapped when arranged on the marker sheet.

Another modified method of this invention that is particularly useful in making miniature patterns is shown in FIGS. 15 through 17 of the drawings. This method of making miniature patterns is especially useful since it utilizes the positive films or pattern replicas 68 which are made in the manner just described. These pattern replicas carry their own blocking distance lines 63 as well as notch lines, fabric alignment lines, identification numbers and the like.

In practicing this modified method, a number of positive films or pattern replicas 68 are positioned against a background consisting of a sheet of white paper 81 which is approximately 4 feet by 5 feet in size. Preferably, the sheet of paper 81 is held on a tiltable vacuum frame 83. A sufficient number of pattern replicas are arranged on the sheet 81 to fill the sheet while allowing clearance between the replicas. A piece of glass is clamped over the pattern replicas and paper to hold them in position. The vacuum table is then tilted from its horizontal position to a vertical position where a photograph is taken of the pattern replicas 57 using a reducing camera 85. The camera has a vacuum frame which holds a positive film. The film conventionally has dimensions of approximately 14 inches by 14 inches. A positive film found suitable for this use is Kodagraph Projection Positive Film SP 281 sold by the Eastman Kodak Company. A five to one reduction is provided by the camera thereby reducing the pattern replicas to one twenty-fifth of their original size. Of course, it should be appreciated that other reduction ratios may be used. The exposed positive film is developed in a Kodak Supermatic Processor Model 242A. The developed film 91 has miniature images 93 corresponding to the images 59 of the pattern replicas 68. For convenience of illustration, the actual relative difference in size between the illustrations of the full size and miniature pattern replicas is not shown. Each image has its blocking distance lines 95 and border lines 96 corresponding to the lines 63 and 64 of the pattern replicas. The individual images 93 and their blocking distance and border lines 95 and 96 are cut from the developed positive film 91 in any convenient manner, for example, with a scissors. The cutting path is not especially critical so long as it is outside of the outermost blocking distance and border lines 95 and 96. The miniature patterns 97 cut from the film carry their own blocking border lines for fabrics having different design repeat intervals, in other words, these miniature patterns may be used for plaids or other fabrics having different design repeat intervals. The miniature patterns 97 may be used in place of conventional miniature patterns which were obtained by use of a pantograph.

A recently developed prior art use of miniature patterns involves the making of a negative print of the miniature patterns as they are arranged on a miniature replica of a marker sheet. This is conventionally done by arranging the miniature patterns on an electrostatic table having a replica of a marker sheet constructed to the same scale as the miniature patterns. A suitable table is sold under the name "TEXET 120" by the Tex-O-Graph Company of New York, New York. When the miniature patterns are properly arranged on the marker sheet replica, a static wand is passed over the patterns and marker sheet to electrostatically hold the patterns to the table. A sheet of negative film is then placed on top of the patterns and the marker sheet. A suitable film for this use is sold under the name "FIMACON TYPE 12" by Fimacon, Inc. of Cochmere, New Hampshire. The film, miniature patterns and marker sheet are exposed to a source of ultraviolet light located beneath the patterns and film. The exposed film is developed by heat in a developing machine. A machine of this type is sold under the name "TEXSET 180" by the Tex-O-Graph Company of New York, New York. This machine has an electrically heated metal roll with a nylon fiber cover which contacts and develops the negative film.

Full size marker sheets are made using the developed negative film by enlarging the film in a continuous enlarger of the type sold under the name "TEXSET 840" by the Tex-O-Graph Company. In this machine, the negative film is enlarged and projected onto a light sensitive marker paper which is developed by contact with a heated roller. A light sensitive marker paper suitable for this purpose is sold under the name "MARKER THERMO PAPER" by the Replica Company of Kansas City, Missouri.

It has been found that miniature patterns made in accordance with the methods of this invention make better marker images using the previously described process than were obtained using the miniature patterns made with a pantograph. Additionally, the miniature patterns of this invention carry their own blocking borders permitting the manufacture of markers for use in cutting plaid fabrics. Of course, it should be understood that the miniature patterns made in accordance with this invention may also be used in other processes and using other equipment than that specifically described.

Figure 18:
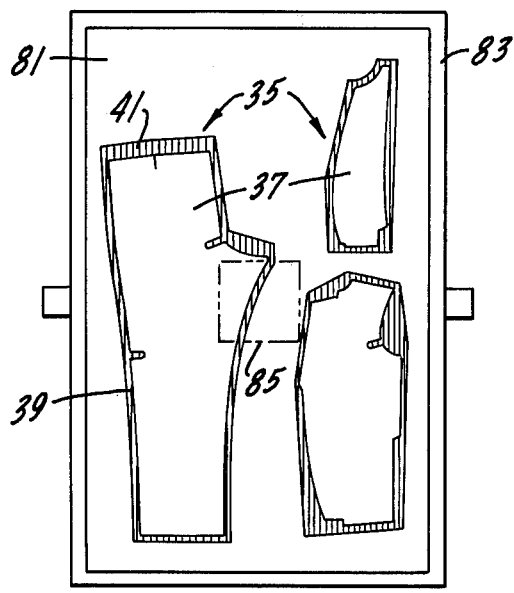
FIG. 18 shows a number of full size pattern film replicas of another type positioned for photographing.
Figures 19, 20:
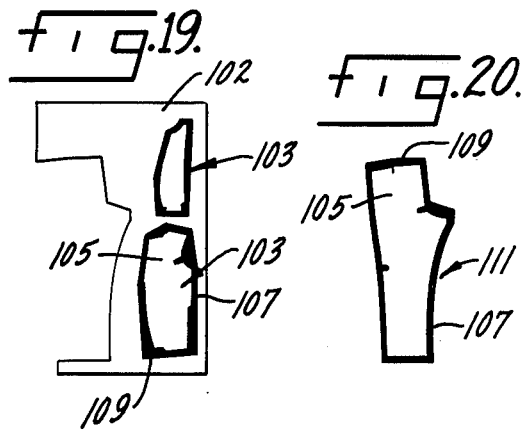
FIG. 19 shows a positive film of the pattern film replicas of FIG. 18 in which the film images of the pattern replicas have been reduced in size and with one of the film images cut from the film.
FIG. 20 shows a reduced film image of a pattern replica after removal from the film.

Another method of making miniature patterns is shown in FIGS. 18 through 20 of the drawings. This method utilizes pattern replicas such as replicas 35 of the type which are shown in FIGS. 5 through 9 of the drawings. As previously described, these replicas are full size negative copies of conventional clothing patterns and have negative images 37 surrounded by opaque narrow outline borders 39 and blocking borders 41. A number of the full size pattern replicas 35 are mounted on a sheet 81 of white paper which is held on the tiltable vacuum frame 83. The glass face is clamped in place and the vacuum frame is tilted to the vertical position. The pattern replicas 35 are copies with a reducing camera 85 onto a positive film 101 using the previously mentioned five to one size reduction. The exposed positive film is developed in the manner previously described thereby producing a developed positive film 102 containing reduced images 103 of the pattern replicas 35. Each image 103 of reduced size includes a negative image 105 corresponding to the negative image 37 and narrow outline borders 107 and blocking borders 109. A scissors or other cutting means is used to cut the pattern replicas from the positive film with the cutting path following the outside edges of the outline and blocking borders thereby producing miniature patterns 111 which have self-contained opaque outline and blocking borders. Since these miniature patterns have only single width blocking borders, they can only be used for a selected plaid or other fabric having a single design repeat interval.

Figure 21:
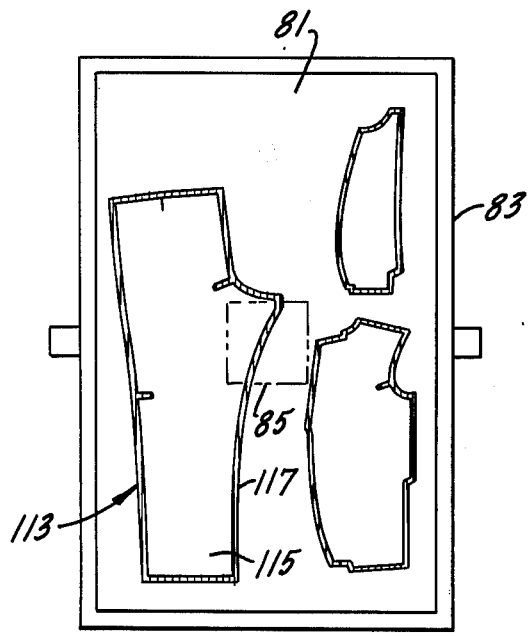
FIG. 21 shows a number of full size pattern film replicas of another type positioned for photographing.
Figure 22:
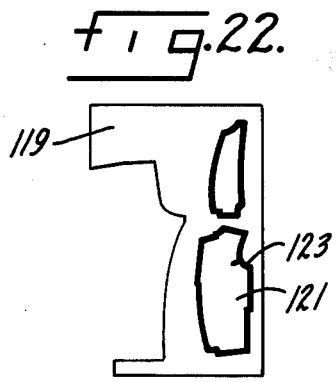
FIG. 22 shows a positive film of the pattern film replicas of FIG. 21 in which the film images of the pattern replicas have been reduced in size and with one of the film images cut from the film.
Figure 23:
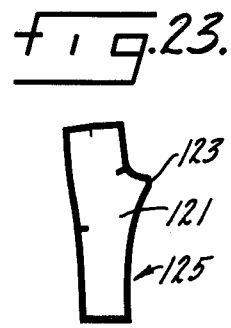
FIG. 23 shows a reduced film image of a pattern replica after removal from the film.

Another method of making miniature patterns is shown in FIGS. 21 through 23 of the drawings. In this modified method, pattern images are copied on negative film in the manner shown and described in FIGS. 5 through 9 of the drawings. However, most of the opaque border of the film surrounding the clear pattern image is removed leaving a ¼ to ⅛ of an inch opaque border surrounding the pattern image to function as an outline of the clear pattern image. A number of these negative patterns 113, each having a clear pattern image 115 surrounded by thin opaque border outline 117 are positioned on a 4 × 5 sheet of white paper 81 mounted on a tiltable vacuum frame 83. When the negative patterns 113 are positioned on the vacuum frame and the glass is clamped to the frame, the frame is tilted from a horizontal position to a vertical position where a photograph of the patterns is taken using a reducing camera 85 containing a positive film. A five to one reduction is obtained. The positive film is developed in the manner previously described, thereby providing a developed positive film 119 containing reduced size images of the pattern replicas 113. The reduced size images each include a clear image 121 corresponding to the clear pattern image 115 and an opaque border outline 123. A scissors or other cutting means is used to separate the reduced images from the developed positive film 119 thereby providing individual miniature patterns 125 each having a thin opaque outline 123 surrounding a clear image 121.

Yet another method of making miniature patterns is shown in FIGS. 24 through 27 of the drawings. In this method, individual pattern pieces 11 are traced on a large sheet of white paper 81 using a dark permanent marking pen. The worker traces the outline 135 of the pattern on the paper and then also marks on the white paper lines 136 indicating notches, dart lines, fabric alignment lines and identification numbers as well as any additional information which is desired. It has been found to be convenient to mount a sheet of paper containing a number of said outlines 135 on a tiltable vacuum frame 83. The vacuum frame is tilted to a vertical position and a photograph of the pattern outlines and informational markings is taken with a reducing camera 85 containing a positive film. As previously described, a five to one reduction has been found satisfactory although other ratios may be used. The positive film is developed in a conventional manner providing a developed positive film 137 having reduced size positive images 139 of the outlines of the patterns. A scissors or other cutting means is used to separate each individual outline image 139 from the positive film thereby forming miniature patterns 141.

Still another alternative method of making miniature patterns in accordance with the teachings of this invention is shown in FIGS. 28 through 30 of the drawings. In this alternate method, full size patterns 11 are mounted against a contrasting background 145 which may be a part of or may be mounted on a vacuum table 83. The color of the background 145 will be determined by the color of the patterns 11 so that a sharp contrast is provided between the edges of the patterns and the background. The contrast, of course, could also be determined by the type of film used. When the patterns are suitably arranged against the background 145, the vacuum table is tilted to its vertical position and a photograph of the patterns 11 against the contrasting background 145 is taken with a reducing camera 85 containing a film. The film is developed in a conventional manner thereby providing a developed film 149 having reduced images 151 corresponding to those of the patterns 11. A scissors or other cutting means is used to separate each of the positive images from the developed film to provide miniature patterns 153.

We claim:

1. A method of cutting pieces of fabric for use in the manufacture of clothing, including the steps of:

reproducing a full size image of a clothing pattern on a light sensitive film by photographic contact printing of said pattern and said film and then developing said exposed film to provide a film replica of said pattern having an image corresponding to that of said pattern with said image being at least partially surrounded by a border, positioning a plurality of said film replicas on a light sensitive marker sheet with said images arranged on said marker sheet so as to provide the most efficient utilization of the fabric to be cut using said marker sheet, exposing said film replicas and said light sensitive marker sheet to a source of light, developing said exposed light sensitive marker sheet to provide a marker sheet having a plurality of closely spaced marker images thereon, and placing said marker sheet on a lay of fabric and cutting said lay of fabric into pieces of fabric by cutting along the outlines of the marker images on said marker sheet.

2. The method of claim 1 in which said light sensitive film is of the reversal type which provides, when developed, a pattern image that is opaque and a border that is clear and further characterized in that said light sensitive marker sheet is also of the reversal type.

3. The method of claim 1 in which said light sensitive film is of the negative type which provides, when developed, a pattern image that is clear and a border that is opaque and further characterized in that said light sensitive marker sheet is of the reversal type.

4. The method of claim 2 in which blocking distance lines are applied to the border of said developed film using a dark permanent marking substance and further characterized in that portions of said film outside of said applied blocking distance lines are removed.

5. The method of claim 4 in which blocking distance lines for designs having different repeat distances are applied to the border of said developed film and indicia to indicate said distances are also applied to said developed film.

6. The method of claim 3 in which portions of said opaque border of said developed film are removed to provide the image with an opaque border on at least one side thereof having a width equal to at least a one-half interval of the design repeat distance of the fabric to be cut and narrower opaque borders around the other sides of said image.

7. The method of claim 3 in which portions of said opaque border of said developed film are removed to provide the image with a narrow opaque border around said image.

8. A method of cutting pieces of fabric for use in the manufacture of clothing, said method including the steps of:
   establishing at least an outline of a full size clothing pattern against a suitable contrasting background,
   photographically reproducing an image of at least said clothing pattern outline on a reduced scale on a light sensitive photographic film to provide a miniature film replica of said pattern,
   removing at least any unnecessary opaque portions of said developed miniature film replica surrounding said image,
   positioning a plurality of said miniature film replicas on a miniature replica of a marker sheet with said images of said miniature film replicas arranged on said marker sheet replica so as to provide the most efficient layout of said images for cutting fabric using a full size enlargement of said miniature replicas and said marker sheet,
   positioning a sheet of light sensitive film against said layout of miniature film replicas,
   exposing said layout of miniature film replicas and said light sensitive film to a source of light,
   developing said exposed light sensitive film to provide a miniature marking sheet film having a plurality of closely spaced marker images thereon,
   projecting an enlargement of said exposed film onto a full size light sensitive marker sheet, developing said exposed full size light sensitive marker sheet to provide a marker sheet having a plurality of full size closely spaced marker images thereon, and
   positioning said marker sheet on a lay of fabric and cutting pieces of fabric from said lay by cutting along the outlines of said marker images on said marker sheet.

9. The method of claim 8 in which at least an outline of each of a plurality of clothing portions are arranged in spaced relationship to one another against a suitable contrasting background, said arrangement of at least said outlines of said clothing patterns are photographically produced as images on a reduced scale on a light sensitive film, and
   each image is separated from said developed film and at least any unnecessary opaque portions of said film surrounding each image are removed.

10. The method of claim 8 in which at least the outline of a clothing pattern is established against a suitable contrasting background by positioning a full size clothing pattern against said contrasting background.

11. The method of claim 8 in which at least the outline of a clothing pattern is established against a suitable contrasting background by tracing the outline of a full size clothing pattern on said background and removing said pattern before photographing said tracing.

12. The method of claim 8 in which at least an outline of a clothing pattern is established against a suitable contrasting background by positioning a full size photographic contact print of a pattern against said background with said print having a clear image of said pattern surrounded by a narrow opaque border.

13. The method of claim 8 in which at least an outline of a clothing pattern is established against a suitable contrasting background by positioning a positive full size photographic contact print of a pattern against said background.

14. The method of claim 8 in which at least an outline of a clothing pattern is established against a suitable contrasting background by positioning a positive full size photographic contact print of a pattern against said background with said film having lines indicating blocking distances marked on said film on the border portion thereof outside of said pattern image.

15. The method of claim 8 in which at least an outline of a clothing pattern is established against a suitable contrasting background by positioning a full size photographic contact print of a pattern against said background with said print having a clear image of said pattern with an opaque border on at least one side thereof having width equal to at least a one-half interval of the design repeat of the fabric to be cut and narrower opaque borders around the other sides of said image.

* * * * *